United States Patent [19]

Motsch

[11] 4,159,538
[45] Jun. 26, 1979

[54] ASSOCIATIVE MEMORY SYSTEM

[76] Inventor: Walter Motsch, No. 67a, Gräfin-Imma-Strasse, Bochum-Stiepel, Fed. Rep. of Germany

[21] Appl. No.: 882,549

[22] Filed: Mar. 2, 1978

[30] Foreign Application Priority Data

Mar. 22, 1977 [DE] Fed. Rep. of Germany ....... 2712575

[51] Int. Cl.² .................... G11C 13/00; G11C 15/00
[52] U.S. Cl. ..................................... 365/49; 365/230
[58] Field of Search ......................... 365/49, 189, 230

[56] References Cited

U.S. PATENT DOCUMENTS

| 3,354,436 | 11/1967 | Winder | 365/49 |
| 3,533,085 | 10/1970 | Murphy | 365/49 |
| 3,685,020 | 8/1972 | Meade | 365/49 |

Primary Examiner—Terrell W. Fears
Attorney, Agent, or Firm—John C. Smith, Jr.

[57] ABSTRACT

An associative memory system in large-scale-integrated semiconductor technology comprises word-organized and bitwise maskable fully associative memory devices which can be arranged in a memory array with a plurality of rows and columns and a control unit for determining and evaluating match information and for handling data transfer via the system interface. A minimum number of package pins for the memory devices is achievable in that in a manner known per se the word address as well as the operation instruction are fetched in coded form and are decoded internally, the input data, output data and mask information share the use of the same package pins, the match information available internally by virtue of a search operation not being indicated parallel, but in the form of a sequence of match codewords externally emitted, each codeword unambiguously identifying a specific match position and the order of emission being controlled by a priority scheme. The circuit arrangement within the memory devices is such that the information applied to the address inputs in case of a write or read operation is interpreted as a local address and also is passed on to the match outputs, but serves as a threshold value in the event of an associative search operation for the purpose of masking the matches already signalled externally, i.e. of precluding them from further indications, in their place the number of that respective match being passed to the match outputs as codeword which of the not yet signalled ones has the highest priority.

4 Claims, 2 Drawing Figures

ASSOCIATIVE MEMORY SYSTEM

BACKGROUND OF THE INVENTION

This invention relates to associative digital data memory systems, and more specifically to an associative memory system in large-scale-integrated semiconductor technology, comprising word-organized and bitwise maskable fully associative memory devices which can be arranged in a memory array with a plurality of rows and columns and a control unit for determining and evaluating match information and for handling data transfer via the system interface. This memory system is usable in digital computer systems of all types where it may be employed as a component part of the main memory, as supplement of the main memory for specific duties, as peripheral memory, e.g. for data base problems, as auxiliary means for certain control and management tasks within the computer as well as a component of an associative processor.

Associative memory systems are known for years in numerous varieties. As far as they are built in semiconductor technology, they make use of devices having only a small storage capacity, e.g. Type 3104 of Intel Corp. (see Data Sheet of May 1971) or Type 93402 of Fairchild Semiconductor (see TTL Data Book of June 1972), which respectively contain only 16 bits. An appreciable increase of capacity is not opposed by the insufficient bit density on the silicon chips any more in view of rapid advances in technological developments, but by the high package cost for the chips. Since each memory word requires an external connection for the match indication, the number of package pins increases linearly with the number of words on the chip. Thereby, not only does the production cost become uneconomical very rapidly, but also the reliability of such components decreases significantly.

German Offenlegungschrift 2,525,287 discloses an associative memory which is intended to reduce the number of external connections. It has the disadvantage that of the entire memory capacity only a partial range is associatively accessible at any one time. Within this partial range, for each word a separate match line with an external pin is required.

SUMMARY OF THE INVENTION

It is the object of the present invention to provide an associative memory system which has a storage capacity not limited by the number of external connections and which permits nevertheless associative access to all stored data words in parallel.

To attain this object the present invention provides an associative memory system in large-scale-integrated semiconductor technology, comprising word-organized and bitwise maskable fully associative memory devices which can be arranged in a memory array with a plurality of rows and columns and a control unit for determining and evaluating match information and for handling data transfer via the system interface, wherein (a) for the memory devices a minimum number of package pins is achievable in that in a manner known per se the word address as well as the operation instruction are fetched in coded form and are decoded internally, the input data, output data and mask information share the use of the same package pins, the match information available internally by virtue of a search operation not being indicated parallel, but in the form of a sequence of match codewords externally emitted, each codeword unambiguously identifying a specific match position and the order of emission being controlled by a priority scheme, (b) the circuit arrangement within the memory devices is such that the information applied to the address inputs in case of a write or read operation is interpreted as a local address and also is passed on to the match outputs, but serves as a threshold value in the event of an associative search operation for the purpose of masking the matches already signalled externally, i.e. of precluding them from further indicating, in their place the number of that respective match being passed to the match outputs as codeword which of the not yet signalled ones has the highest priority, (c) for the purpose of extension of the system word length beyond the device word length the memory array is configurated such that a required number of memory devices are arranged in parallel regarding the data, but in series regarding the addresses and matches by passing the match outputs of each device to the address inputs of the next device within a row of the memory array, and (d) the control unit is designed in such a way that it after detecting and evaluating a match valid for the entire memory word length passes the word address thereof increased by 1 as a new threshold value to the address inputs of the first device of an array row and compares it with the match codeword appearing subsequently at the match outputs of the last device of the same row, in case of coincidence the next match being able to be detected and evaluated, while in case of incoincidence the match codeword is used as new threshold value for the further search.

The most essential of these features for the reduction of the number of pins is a coding of the match indication. This initially brings about the problem that all devices which for the purpose of extending the system word length are arranged parallel must output the same match codeword so that for the entire word a match can be recognized. The excessive circuitry required for the identity check is eliminated in that the memory devices are arranged in series regarding their address inputs and match outputs. For match detection, thus the comparison of the word address of the first device with the match codeword of the last device suffices.

All associative memories implemented in the semiconductor technology up to now are limited for associative search operations to the word parallel identity check of the stored data with a given descriptor. A completion of the invention therefore is concerned with the implementation of the search criteria "greater than" and "less than" by extension of the logical comparison circuit associated with each memory cell. This permits the associative identification of those data words the dual number value of which as a whole or also in segments is greater than and less than, respectively, that of the descriptor. As a consequence thereof, further modifications of the invention are concerned with the use of different search criteria to different segments (devices) of the data words as well as the execution of multiple interrogations. The latter is achieved according to the invention in that different search criteria using different descriptors are subsequently applied for the same segments of the data words and the match information resulting from each individual search operation is logically connected to the intermediate result accured up to then and stored in the match register. Also, it can be provided for that a memory word selected by the address is loadable into the data register by device-internal feedback as new descriptor for the next search cycle.

Finally, the intention to detect and evaluate the matches resulting in a search operation as quickly as possible is supported by a condition output at the memory devices. By means thereof, the control unit immediately recognizes the missing of (further) matches in a row of the memory array and locates the next match the quicker.

Associative memory devices of the illustrated type are characterized by a series of significant advantages. They may be designed, fabricated and packaged following the same technological principles as other semiconductor memories. Their maximum storage capacity no longer depends on the permissible pin number, but solely on the technologically achievable bit density, and it may therefore be increased by many times compared with that of products presently offered. For an according large-scale-integration, the price per bit as well as the power dissipation may be drastically reduced. Also, by displacing a part of the detection logic onto the chip, the requirement for additional circuits is diminished and numerous connection lines between the devices are eliminated. A memory system of this type consequently is not only cheaper, simpler and more compact in production, but also more reliable mechanically and electrically. The array structure renders independent the design of the control unit from the overall word length and thus ensures the required modularity.

Memory devices permitting "greater than" and "less than" comparisons are of a much higher performance than all those available up to now and open completely new associative operation capabilities. They permit the combination of complete sequences of interrogations to a single one and thus reduce voluminous and time-intensive programs to a few instructions. Numerous data processing problems take profit of this simplification such as the sorting and classification of data files, the data base management, the character and pattern recognition, the language translation and code conversion, the interactive man-machine communication.

BRIEF DESCRIPTION OF THE DRAWINGS

An embodiment of the invention will now be described by way of example and with reference to the accompanying drawings, in which.

DESCRIPTION OF THE PREFERRED EMBODIMENT

Figure 1:
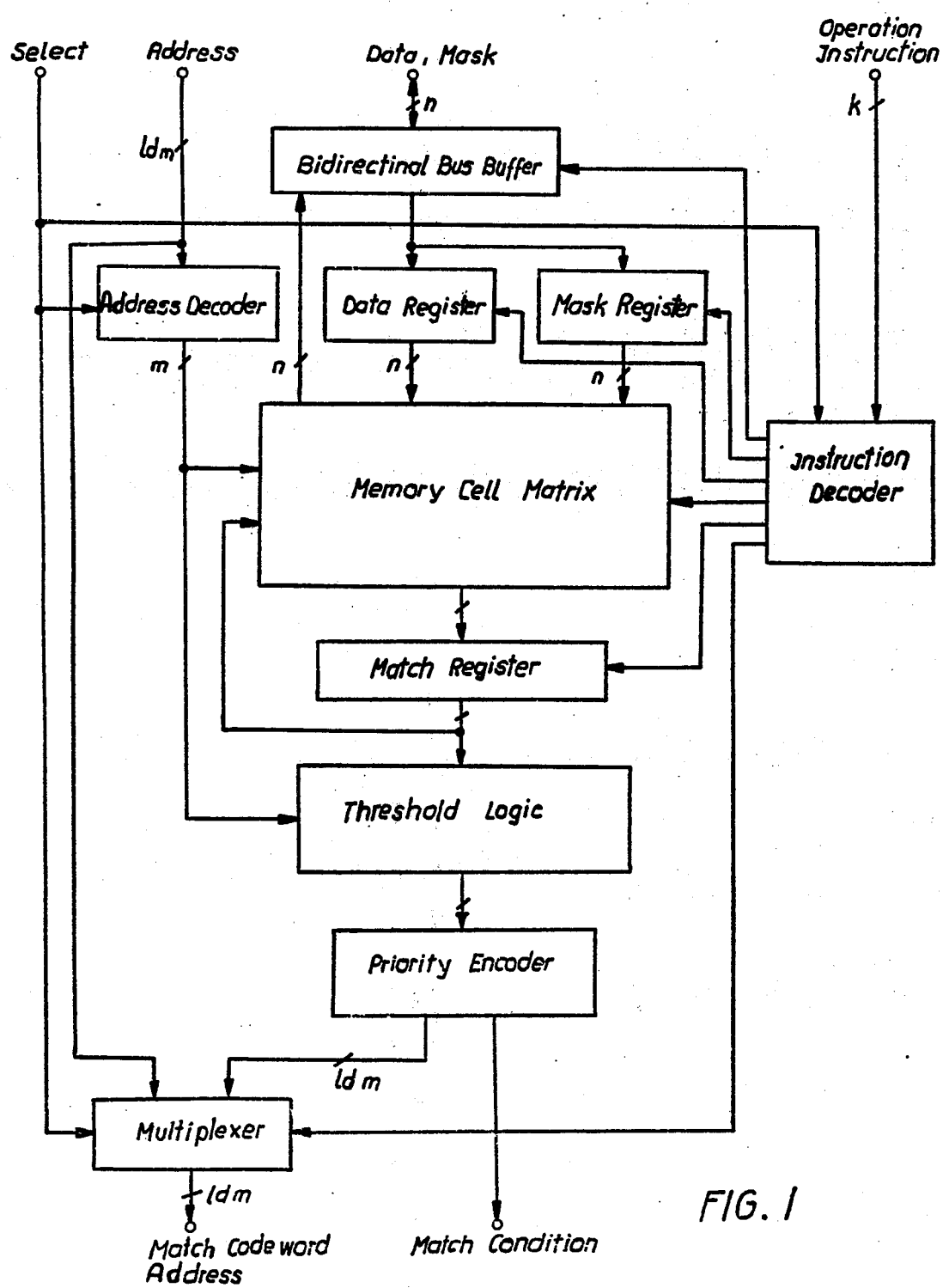
FIG. 1 is a block diagram of a word-organized and bitwise maskable fully associative memory device.

The reference character m generally designates the number of memory words of a device, and the reference character n designates the number of bits per word (word length) of a device. p and q generally indicate the number of rows and columns of devices 11–13 in the memory array. E.g. the device designated 13 is arranged in the first row and in the third column. $1d$ is the abbreviation for the logarithm to the base 2. A device according to FIG. 1 thus only requires $2 \cdot 1dm + n + k + 2$ logical external connections, for the variable number k of connection lines depending on the volume of the implemented functions the value 3, 4 or 5 having to be employed.

For conventional write and read operations, the applied address is passed via the multiplexer to the match outputs and is applied from there to the next device; at the same time, it is converted by the address decoder into a select signal for a single of the m installed words. For associative search operations, initially the mask and the search data (descriptor) consecutively are loaded into the corresponding registers (mask register, data register). Thereupon, each stored word fulfilling a given search criterion regarding the descriptor signals a match. The entire match information thus appears at the output of the memory cell matrix in a fully parallel form and is transferred to the match register, provided there is one. The priority encoder generates the number of the match with the highest priority which is then emitted to the exterior as match codeword via the multiplexer. The match codeword may be used directly as address for a subsequently write or read operation. Also, it is applied to the threshold logic in the meaning of a threshold value for the determination of the next match. This causes the exclusion of all higher order and thus already detected matches from coding, whilst of the remaining (non-masked) matches a codeword is again formed for the match with the highest priority. The procedure is repeated until the signal for the match condition indicates that no matches are present any more underneath the threshold in the address range of the memory.

The instruction decoder interprets the k bits of the operation instruction and activates the desired memory function (writing, reading, searching, loading of registers, and possibly selection of the search criterion). In particular it may cause that all locations marked by a match are simultaneously written entirely or in part by a word supplied via the data lines. This has a condition, however, a feedback of the match signals to the word selection lines of the memory cell matrix. Via the select input, the execution of the instructions for the respective device may be disabled; at the same time, the outputs for the data and for the match codeword may be switched into a high-impedance state, and this permits the simple wired-OR-connection thereof with the corresponding outputs of other devices.

Figure 2:
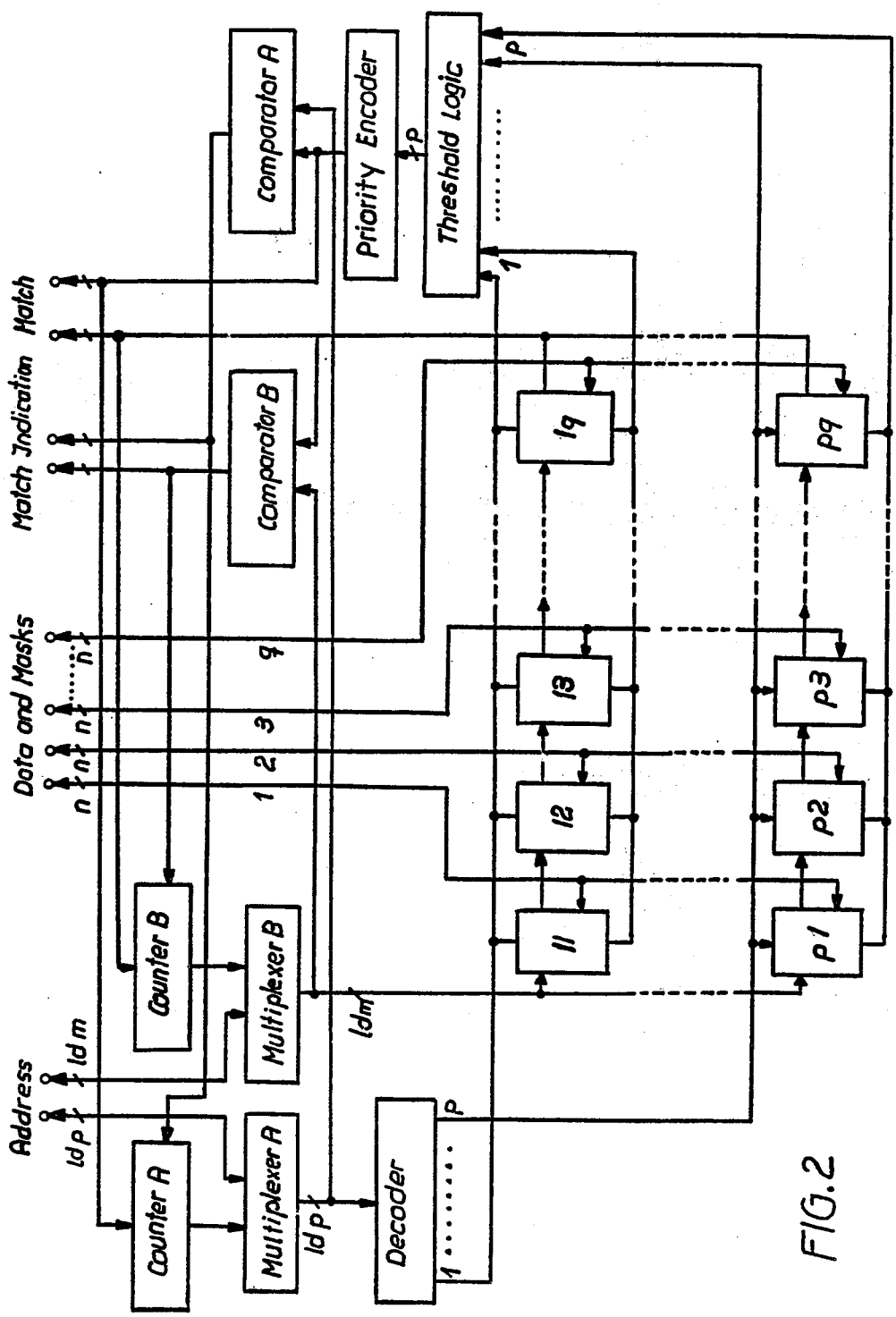
FIG. 2 is the structure of an associative memory system with an array of memory devices and with the most important components of the control unit.

In FIG. 2, the arrangement of p rows and q columns of devices into a memory array has been illustrated. It will be recognized how within a row the devices are in parallel only regarding the data, on the other hand are in series regarding the address and match lines. For write and read operations, the address via the device-internal bypassing arrives at all columns. When associatively searching, the match codeword of the one device serves as threshold value for the subsequent one and there possibly produces a different codeword. The comparator B of the control unit compares the match codeword of the last device with the preset threshold value for the first one. If both variables are coincident, there is a match for the corresponding data word. In this case, a match signal is emitted which is then evaluatable exteriorly by means of the match codeword offered at the same time. After this evaluation, the counter B is incremented, and thus a new threshold value is produced. On the other hand, upon incoincidence the match codeword is loaded into the counter B, and it is used as new threshold value. The continuous changeover between the preset of a threshold address for the first device and the comparison thereof with the match codeword of the last device of a row ensures a very small number of memory accesses prior to finding the next match.

The same function which the counter B and the comparator B perform for the addressing within the individual devices is taken over by the counter A and the comparator A for the addressing of the device rows. Via a decoder, a select signal is generated for activating a single device row. Only by this row, the respective bus lines may have applied data and a match codeword, respectively. In order to exclude the already scanned rows from the further search and in order to specify that which can be expected to provide a match as next one, in analogy to the interior of a device, again a threshold logic and a priority encoder are required. For the external addressing of the memory system, multiplexers are provided between the counters and the array. (For the purpose of clearness FIG. 2 does not include the k lines for the operation instruction; these are parallel to the memory devices.)

The invention may be implemented in other specific forms without departing from the spirit or essential characteristics thereof. The implementation therefore is to be considered in all respects as illustrative and not restrictive.

What is claimed is:

1. An associative memory system comprising:
   (a) a memory array matrix having a plurality of rows and columns of memory cells,
   (b) address inputs,
   (c) means for supplying said address inputs in series to said rows in said matrix,
   (d) data inputs,
   (e) means for supplying said inputs in parallel to said columns of said memory cells, and
   (f) means for comparing the output of the first memory cell with the output of the last memory cell in at least one row for determining a match indication.

2. The system of claim 1 further comprising priority encoding means coupled to said means for comparing said address inputs and said data inputs for emitting the match with the highest priority.

3. The system of claim 1 further comprising a counter coupled to the output of said means for comparing said address inputs and data inputs for controlling said means for supplying said address inputs.

4. The system of claim 1 further comprising means connected to said means for comparing said address inputs and said data inputs for masking matches previously indicated as matched.

* * * * *